(12) United States Patent
Takai et al.

(10) Patent No.: US 7,573,765 B2
(45) Date of Patent: Aug. 11, 2009

(54) SEMICONDUCTOR MEMORY DEVICE

(75) Inventors: Hideyoshi Takai, Tokyo (JP); Takamichi Kasai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 11/846,026

(22) Filed: Aug. 28, 2007

(65) Prior Publication Data

US 2008/0056050 A1  Mar. 6, 2008

(30) Foreign Application Priority Data

Sep. 1, 2006  (JP)  .............................. 2006-237651

(51) Int. Cl.
*G11C 7/00* (2006.01)
(52) U.S. Cl. ................ 365/201; 365/185.09; 365/233.5
(58) Field of Classification Search ................ 365/201, 365/233.1, 233.5, 191, 194, 185.09, 189.17, 365/230.06, 233
See application file for complete search history.

(56) References Cited

U.S. PATENT DOCUMENTS 5,548,560 A  8/1996 Stephens, Jr. et al.
5,745,431 A *  4/1998 Pontius et al. ............ 365/233.5
6,782,498 B2 *  8/2004 Tanizaki et al. ............. 714/733
7,266,039 B2 *  9/2007 Chiang .................... 365/233.5
2004/0246337 A1  12/2004 Hasegawa et al.

FOREIGN PATENT DOCUMENTS

JP  2004-294224  10/2004

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A semiconductor memory device 100 is proposed including an internal address generation circuit 3, a first internal address control signal generation part 4, a second internal address control signal generation part 11, and an internal address control signal selection circuit 10 having an OR gate transistor 12. The internal address generation circuit 3 generates an internal address signal based on input address data. The first internal address control signal generation part 4 generates a first internal address control signal and having a function which fixes the first internal address control signal at a predetermined level with the elapse of a fixed period of time. The second internal address control signal generation part 11 generates a second internal address control signal corresponding to an input of a predetermined command. The OR gate transistor 12 transmits either the first internal address control signal or the second internal address control signal to the internal address generation circuit 3.

19 Claims, 7 Drawing Sheets

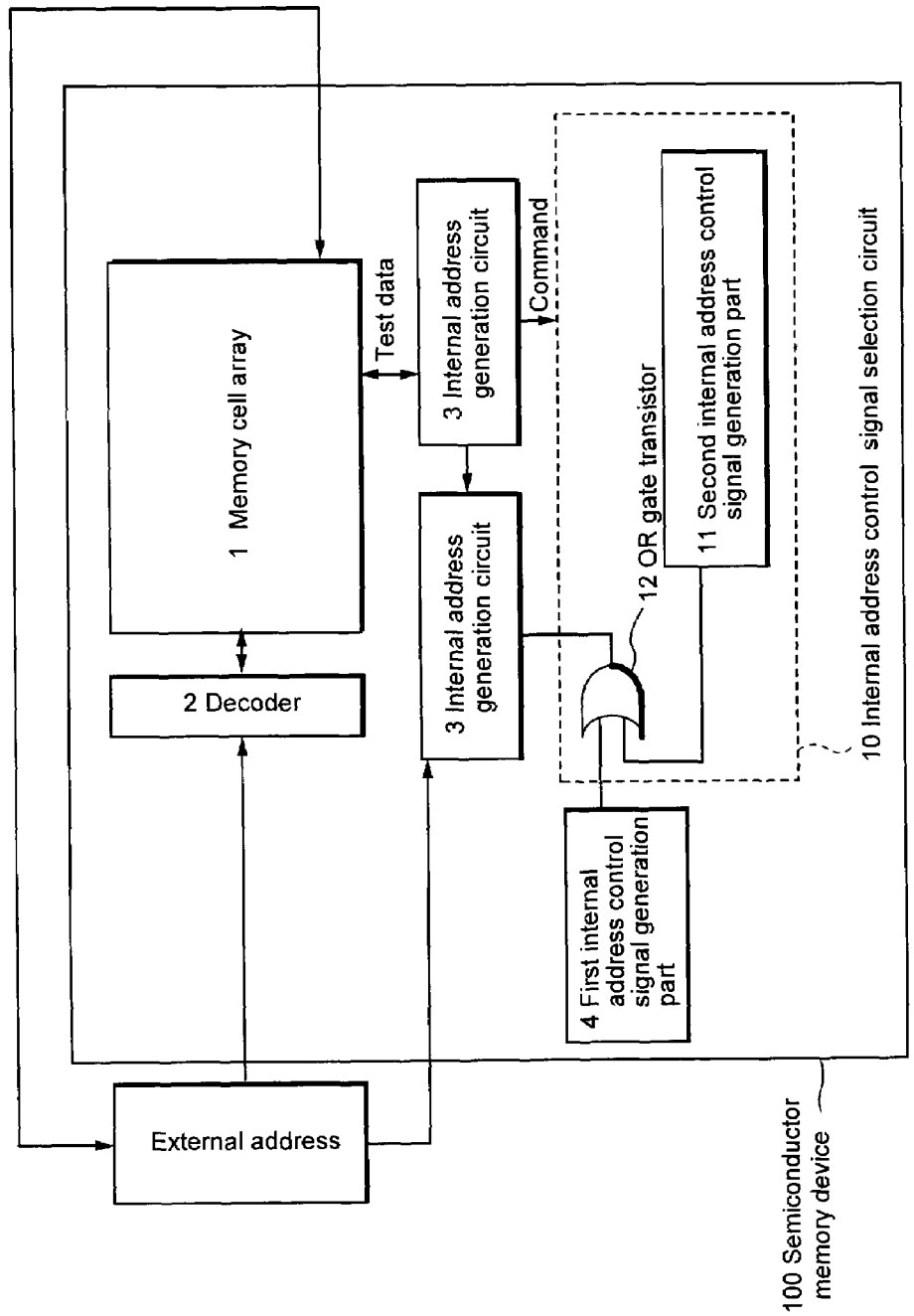

SEMICONDUCTOR MEMORY DEVICE

CROSS REFERENCE TO RELATED APPLICATION

This application is based on and claims the benefit of priority from the prior Japanese Patent Application No. 2006-237651, filed on Sep. 1, 2006, the entire contents of which are incorporated herein by reference.

BACKGROUND OF THE INVENTION

1. Field of the Invention

This invention is related to technology used in a semiconductor memory device, especially used in a screening test of a NOR type flash memory and SRAM.

2. Description of the Related Art

During a screening test before shipment of a semiconductor device, what is generally called a READ test is conducted with the purpose of detecting a defective mode which is called a multiple address selection.

Furthermore, as one method of simplifying a test for solving the difficulty of testing on a large scale and complex semiconductor integrated circuit, a Built-In Self Test (referred to below as BIST) control circuit is incorporated into a semiconductor memory device itself as shown in Japanese Laid-Open patent Publication No. 2004-294224 (patent document 1).

However, in testing a NOR type flash memory or an SRAM (Static Random Access Memory) having an automatic sleep function by a tester or BIST control circuit, when the amount of time where an internal address control signal does not change, passes a certain amount of time, the automatic sleep function is activated and the internal address control signal becomes a fixed mode, making the result of the test to the same state as the multiple address selection, which is caused by a defect. Therefore, it is no longer possible to detect a defective mode by the read test.

BRIEF SUMMARY OF THE INVENTION

In one embodiment of the present invention, a semiconductor memory device is proposed including an internal address generation circuit which generates an internal address based on address data which is input, a first internal address control signal generation part which generates a first internal address control signal and having a function which, with the elapse of a fixed period time, fixes the first internal address control signal at a predetermined level, a second internal address control signal generation part which generates a second internal address control signal which corresponds to the input of a predetermined command and an internal address control signal selection circuit having an OR gate transistor which transmits either the first internal address control signal or the second internal address control signal to the internal address generation circuit.

In another embodiment of the present invention, a semiconductor memory device is proposed which comprises an internal address generation circuit which generates an internal address signal based on an address data input; a built in test control circuit which generates a test pattern and self judges a test result; a first internal address control signal generation part which generates a first internal address control signal and has a function for fixing said first internal address control signal at a predetermined level with the elapse of a fixed period of time; a second internal address control signal generation part which generates a second internal address control signal corresponding to an input of a predetermined command; and an internal address control signal selection circuit having an OR gate transistor which transmits either said first internal address control signal or said second internal address control signal to said internal address generation circuit.

In another embodiment of the present invention, a semiconductor memory device is proposed which comprises a memory cell array in which a plurality of memory cells are arrayed in a matrix; an internal address generation circuit which generates an internal address signal which selects one or more memory cells from among said plurality of memory cells; a first internal address control signal generation part which generates a first address control signal which leads to generate said internal address signal; a second internal address control signal generation part which generates a second address control signal which leads to generate said internal address signal; and an OR gate transistor including an input part which is connected to said first internal address control signal generation part and said second internal address control signal generation part and, an output part which outputs said internal address control signal which continues to be transmitted at a predetermined voltage when in test mode to said internal address generation circuit.

BRIEF DESCRIPTION OF THE DRAWINGS

FIG. 7 is an outline drawing of the construction of a semiconductor memory device relating to a second embodiment of this invention.

DETAILED DESCRIPTION OF THE INVENTION

Figure 1:
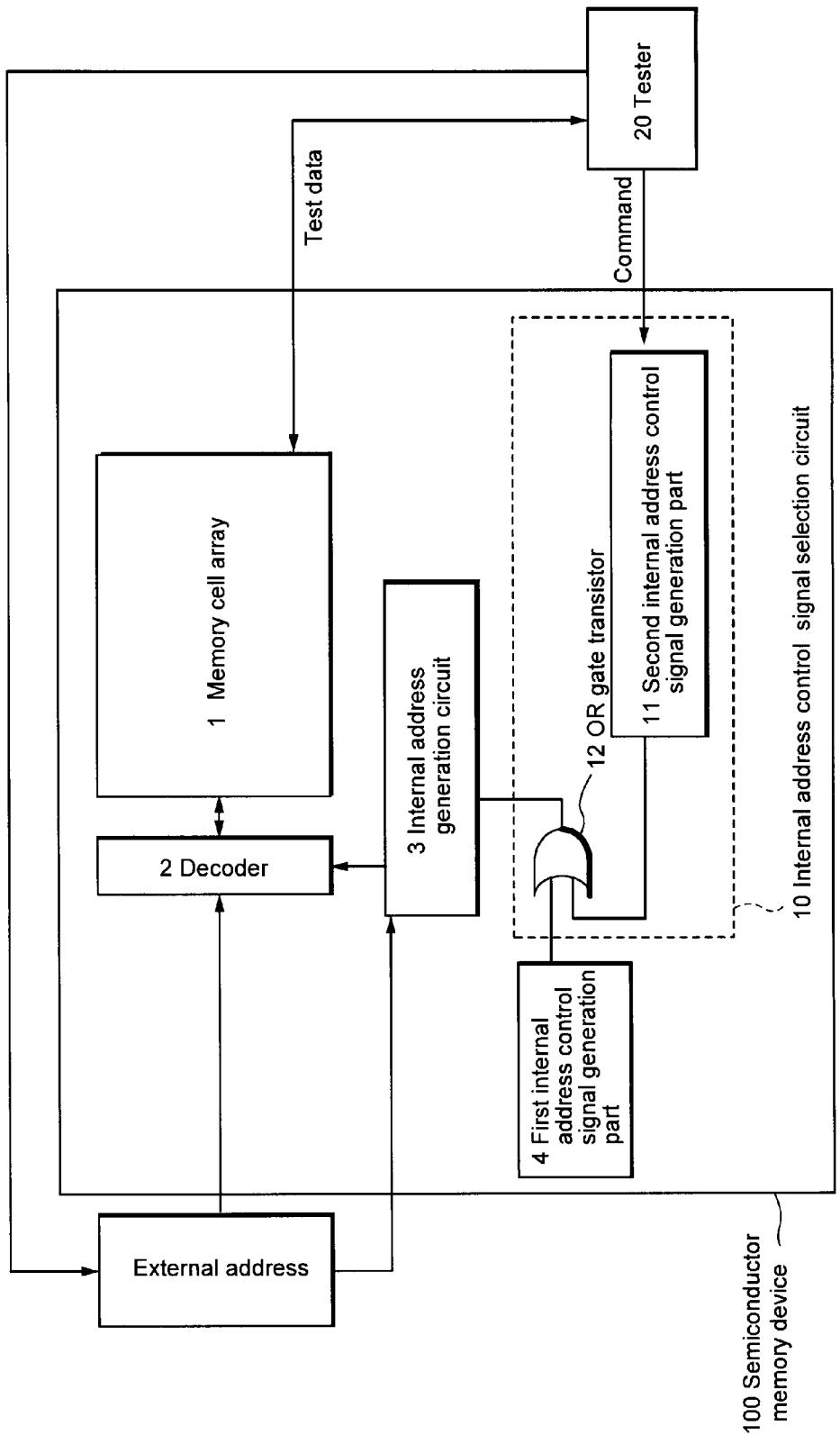
FIG. 1 is an outline drawing of the construction of a NOR type flash memory relating to a first embodiment of this invention.

In a test before shipment of a semiconductor memory device, a test which is generally called a READ test where a predetermined data is programmed to and read from memory cells of a semiconductor memory device is conducted on. The detection of a defective mode which is called a multiple address selection which is caused by an extremely high resistance mounted during the manufacturing process is one purpose of this READ test.

The READ test is conducted by a procedure roughly described as follows using a predetermined tester. Firstly, the semiconductor memory device to be tested is set in the tester. A usual tester arranges a fail memory in order to analyze a test result, and a fail memory address, which corresponds to a memory cell of a semiconductor memory device which is tested, is assigned. That is, because the memory cell is placed on the intersection of a plurality of word lines and a plurality of bit lines within the semiconductor memory device, a memory cell of the semiconductor memory device or a memory cell block including a plurality of memory cells is made a unit for the tester detecting a defective section. For this reason, the fail memory address is allocated and the defective sections become easier to be detected. Therefore, the fail memory address is basically allocated based on a word line and a bit line.

A test program and a signal which specifies a fail memory address corresponds to an address of a memory cell or a memory cell block which is the object of a test are input into the tester. The input signal is transmitted to the tested semiconductor memory device as an external address signal. The external address signal which was input into the tester is converted within the tested semiconductor memory device to an internal address signal which corresponds to a memory cell or a memory cell block and a memory cell or a memory block to be tested is selected.

If the target memory cell or memory cell block is selected a predetermined data is programmed. An L level Fix signal (can also be an H level Fix signal) is applied according to this data programming. In a similar way, all the memory cells or memory cell blocks of the tested semiconductor memory device are programmed with predetermined data.

Then, the fail memory address signal which is tested is input into the tester and similar to the data programming, the target memory cell or memory block is selected and the programmed data is read.

By the method cited above, data is programmed and then the data is read, and whether the programmed data and the read data are identical or not is checked. The read data and the programmed data are compared and when they are not identical the memory cell or the memory cell block is considered defective. Alternatively, if the read data matches an expected value it is considered non-defective. The screening test is conducted by the above cited method.

Incidentally, a NOR type flash memory or an SRAM has a function called an automatic sleep. That is, a function which fixes an address within the device to a Fix L or a Fix H in order to realize low energy consumption, when a certain fixed period of time has elapsed. The function controls energy consumption during a read operation and at the time of an asynchronous read, when an address input does not change, generally in more than 150 ns, the device automatically activates sleep mode, a current becomes a standby current and together with this an internal address control signal (DECEN) within the device is made to be fixed at Fix L or Fix H. If the address is changed the sleep mode is automatically released and the data of the changed address is output. Whether it is fixed at an (L) level or an (H) level is determined depending on devices in advance and by such a fixing energy consumption within the device is controlled.

In the first embodiment of the present invention, when a predetermined period of time has elapsed, in a NOR type flash memory or an SRAM which is made to fix an internal address control signal (DECEN) within a device at a (L) level or a (H) level, a defective mode of a multiple address selection (selection defect) is detected and it is able to judge whether there is a fault by the READ test. However, this embodiment is one embodiment of the present invention and the present invention is not limited to this. Also, with regards to the effects of the present invention, the semiconductor memory device is not limited to a NOR type flash memory or an SRAM as long as it is a device which has a function which fixes an internal address control signal (DECEN) to L or H within the device when a fixed period of time has passed.

Below, a semiconductor memory device relating to one embodiment of the present invention will be explained based on the drawings. FIG. 1 is an outline drawing of the construction of a NOR type flash memory relating to one embodiment of the present invention. As is shown in FIG. 1, the semiconductor memory device 100 relating to one embodiment of the present invention is arranged roughly with a memory cell array 1, a decoder 2, an internal address generation circuit 3, a first internal address control signal part 4 and an internal address control signal selection circuit 10 and at the time of testing the test is conducted by an external tester 20.

The memory cell array 1 is divided into an m number of blocks (BLOCK 0, BLOCK 1 . . . BLOCKm). Here, a block is the smallest unit in which data is erased. Then, each block from BLOCK0 to BLOCK m is made up of k number of NOR cell units 0 to k and each NOR cell unit is made up of a plurality of memory cells connected in parallel. The k number of memory cells constitute a unit called a page.

Although not shown in FIG. 1 the decoder 2 includes a plurality of row decoders and a plurality of column decoders. The plurality of row decoders are each connected to a word line and receive a signal generated by the internal address generation circuit 3 based on an external address and at the time of programming and erasing predetermined voltages are applied to each word line to select a target word line. The plurality of column decoders are each connected to a bit line and receive a signal generated by the internal address generation circuit 3 based on an external address and at the time of programming and erasing predetermined voltages are applied to each bit line to select a target bit line.

The decoder 2, as stated above, is connected to the memory cell array 1 via word lines and bit lines and, based on an external address transmitted from an external device such as a tester and based on address data transmitted from the internal address generation circuit 3, a word line and bit line, which are connected to an target memory cell, are selected and a predetermined voltage is applied to the selected word line and bit line and data is programmed to or erased from the target memory cell.

One end of the internal address generation circuit 3 is connected to the decoder 2 and the other end is connected to the internal address control signal selection circuit 10. Also, an external address is transmitted from the tester 20 to the internal address generation circuit 3.

The external address which is transmitted from the tester 20 is converted to an internal address and the internal address generation circuit 3 generates an internal address signal which selects a target memory cell and transmits the internal address signal to the decoder 2. Because a memory cell is formed at the intersection of a word line and a bit line, it is possible to specify a target memory cell by specifying a plurality of word lines and a plurality of bit lines where each memory cell intersects. Therefore, while converting an address information input externally to an internal address specified by a word line and a bit line, an internal address signal which specifies a target memory cell is generated and transmitted.

The first internal address control signal generation part 4 is connected to the internal address control signal selection circuit 10. The first internal address control signal generation part 4 generates a first internal address control signal (DECEN 1) and transmits this to the internal address generation circuit 3 via the internal address control signal selection circuit 10. Here, the semiconductor memory device 100 relating to one embodiment of the present invention, includes a function which generates a first internal address control signal (DECEN 1) which fixes an address within the device at Fix L or Fix H after a certain fixed period of time has elapsed. In the present embodiment the first internal address control signal generation part 4 fulfills this function. However, one embodiment of this invention is not limited to this.

In usual mode (non test mode) the semiconductor memory device 100 is controlled based on the first internal address control signal (DECEN 1) generated by the first internal control signal generation part 4. That is, the internal address generation circuit 3 which receives the first internal address control signal (DECEN 1) transmitted via the internal address control signal selection circuit 10 generates an internal address signal for selecting a target memory cell based on this first internal address control signal (DECEN 1) and an external address input externally, and transmits the internal address signal to the decoder 2. The decoder 2 which receives the internal address signal selects a target word line and a bit line based on the specified internal address and by applying a predetermined voltage the target memory cell is selected.

The internal address control signal selection circuit 10 is made up of a second internal address control signal generation part 11 and an OR gate transistor 12. The semiconductor memory device relating to one embodiment of the present invention includes this internal address control signal selection circuit 10.

Firstly, the elements of the internal address control signal selection circuit 10 will be explained. The second internal address control signal generation part 11 receives a command from the tester 20 at the time of test mode and generates a second internal address control signal (DECEN 2). This second internal address control signal (DECEN 2) is a signal which instructs the internal address generation circuit 3 to generate an internal address signal based on an external address input externally. Also, unlike the first internal address control signal (DECEN 1) which is generated by the first internal address control signal generation circuit 4, the second internal address control signal (DECEN 2) is a signal which maintains a fixed level and, even if a predetermined period of time has elapsed, does not become fixed at an L level or H level.

One end of the OR gate transistor 12 which is arranged within the internal address control signal selection circuit 10 is connected to the above stated first internal address control signal generation part 4 and the other end is connected to the second internal address control signal generation part 11 and yet another end is connected to the internal address generation circuit 3. This OR gate transistor 12 transmits the first internal address control signal (DECEN 1) from the first internal address control signal generation part 4 or the second internal address control signal (DECEN 2) from the second internal address control signal generation part 11 to the internal address generation circuit 3. In a NOR type flash memory and an SRAM, once a predetermined period of time has elapsed, the first internal address control signal (DECEN 1) is fixed at an L level (Fix L) or an H level (Fix H) in the first internal address control signal generation part 4 and energy consumption is suppressed. However, in the semiconductor memory device relating to one embodiment of the present invention, even if the first internal address control signal is fixed, the OR gate transistor 12 still transmits the constant level second internal address control signal (DECEN 2) from the second internal address control signal generation part 11 to the internal address generation circuit 3 in the test mode.

The second internal address control signal generation part 11 which has the above stated function and the internal address control signal selection circuit 10 which has the OR gate transistor 12 receive a command from the tester 20 during the test mode and keep generating the second internal address control signal (DECEN 2) and transmitting this to the internal address generation circuit 3. Therefore, even if the automatic sleep function of a NOR type flash memory or an SRAM begins to operate and the first internal address control signal (DECEN 1) is fixed at Fix L or Fix H in the first internal address control signal generation part 4, because the second internal address control signal (DECEN 2) continues to be supplied, an internal address appropriately switches in the internal address generation circuit 3 corresponding to the switching of an external address. Therefore, also in a NOR type flash memory and an SRAM, selection defect of multiple address selection can be detected by READ test.

Here, the tester 20 is a device which checks the operation of the semiconductor memory device 100 and it is possible to detect defective sections within the semiconductor memory device by this tester 20. In FIG. 1, a detailed construction drawing of the tester 20 has been omitted, however, the tester 20 roughly has the following construction with a control part, a test part, a fail memory, an address generation circuit, and so on. The control part controls the entire tester. The test part is connected to a semiconductor memory device 100 which is tested and conducts transmission of data between the tester 20 and the semiconductor memory device 100 based on instructions from the control part. The fail memory records the test result (Fail data) from the semiconductor memory device 100 which is tested. The address generation circuit specifies a test section of the semiconductor memory device 100 which is tested.

The semiconductor memory device 100, which is tested, is set with the tester 20 and an external address which specifies the test section to be tested and test data used in a test is provided from the tester 20. Also, when the test begins, the tester 20 gives out a command which instructs the semiconductor memory device 100 to operate in the test mode. As stated above, the internal address control signal selection circuit 10 which receives the command generates a second address control signal (DECEN 2) in the second internal address control signal generation part 11 and transmits this to the internal address generation circuit 3.

Also, the tester 20 transmits a test program which has been set in advance to a memory cell array 1 and performs a predetermined test, receives a test result (Fail data) from the memory cell array 1 and records a memory cell or a memory cell block which has been detected as defective by the test.

Figure 3:
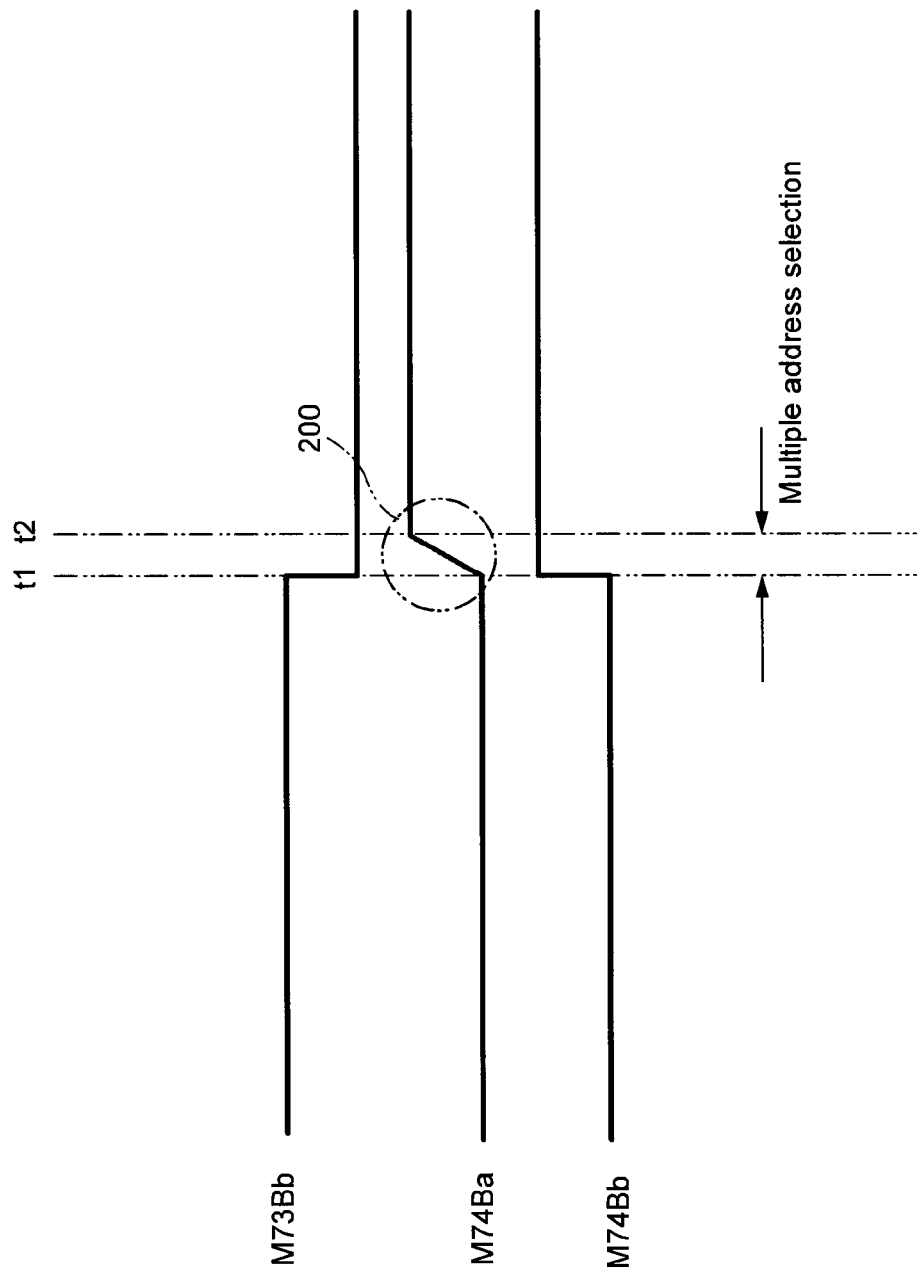
FIG. 3 is a timing chart which shows an example of a multiple address selection in a bit line at the time of test of a NOR type flash memory.
Figure 4:
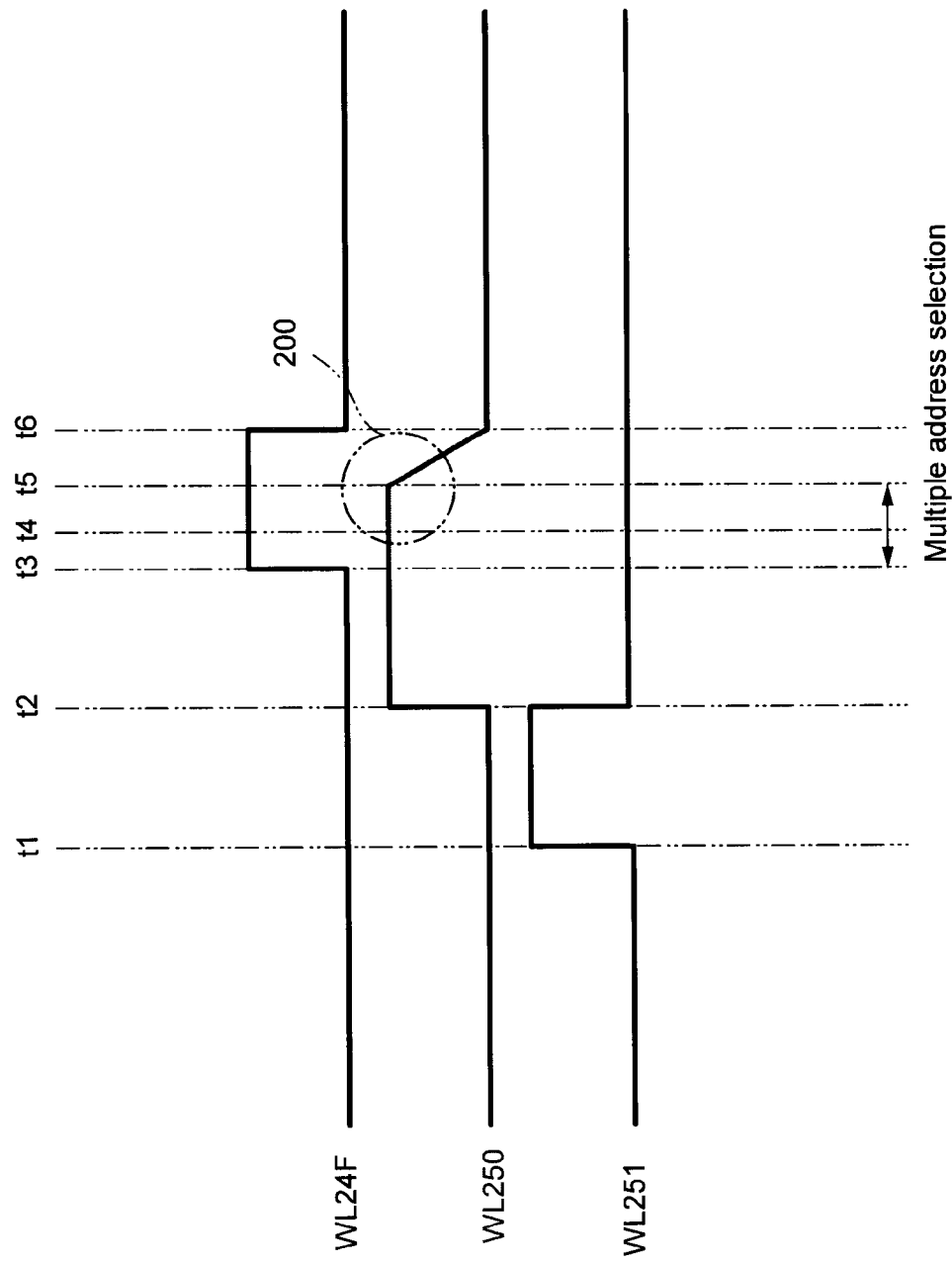
FIG. 4 is a timing chart which shows an example of a multiple address selection in a word line at the time of test of a NOR type flash memory.
Figure 5:
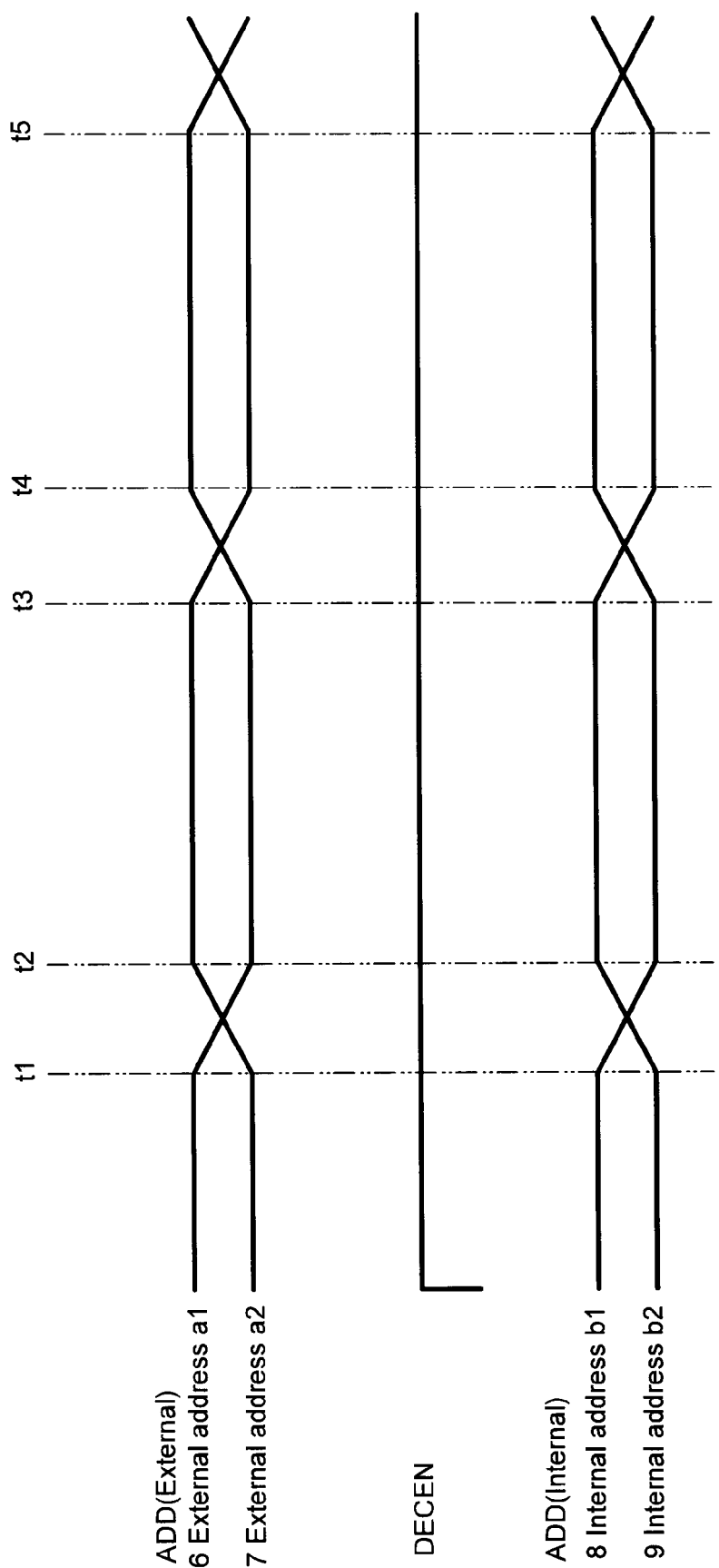
FIG. 5 is a timing chart which shows the switching of an external address and an internal address at the time of short cycle READ.
Figure 6:
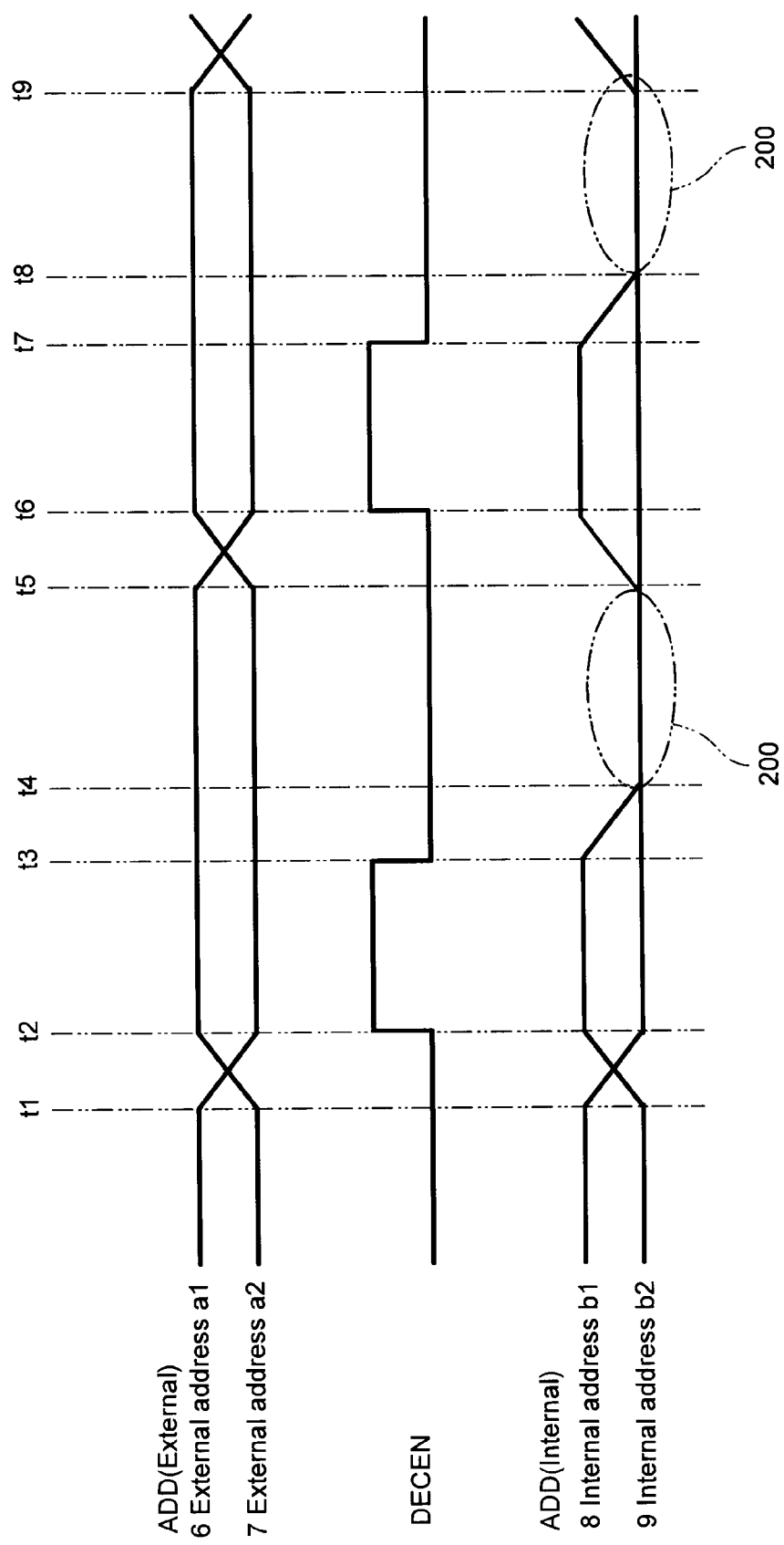
FIG. 6 is a timing chart which shows the switching of an external address and an internal address at the time of long cycle READ.

Here, a defective mode of a multiple address selection, and the switching between an external address and an internal address in a NOR type flash memory or an SRAM in the case where an internal address control signal (DECEN) is fixed at an L level or an H level after a fixed period of time has elapsed will be explained. FIG. 3 and FIG. 4 are timing charts which illustrate a multiple address selection at test mode of a NOR type flash memory by an example. Also, FIG. 5 is a timing chart which shows the switching between an external address and an internal address at the time of short cycle READ in a NOR type flash memory. FIG. 6 is a timing chart which shows the switching between an external address and an internal address at the time of long cycle READ in a NOR type flash memory.

FIG. 3 shows the bit lines M73Bb, M74Ba and M74Bb. Also, FIG. 4 shows the word lines WL24F, WL250 and WL251. In FIG. 3 the bit lines M74Ba and M74Bb become a pair. A bit line M73Bb becomes a pair with the bit line M73Ba. However, for the sake of explanation it is omitted from the drawing.

The multiple address selection is a defect where a plurality of memory cells are selected at one time because a memory cell which has already been selected and should be switched to be unselected remains in a selected state, so that both the memory cell which should be unselected and a memory cell which is switched correctly to be selected are selected together. Such a defect occurs as described below; the switching of an internal address which should be switched corresponding to the switching of an external address is not completed within a predetermined period of time by a high resistance mounted during the manufacturing process, then, even if one memory cell is correctly switched to be selected while the other memory cell which should be switched to be unselected is not switched because the switching of the other is late.

Good!

The switching of the internal address is carried out by the switching of a voltage. Therefore, when switching the voltage from an (L) level to an (H) level the voltage is increased, however, in the case where an internal address which is mounted with a high resistance is switched to an (H) level the voltage cannot be lifted from an (L) level to an (H) level within a predetermined period of time due to the influence of the mounted high resistance and it is lifted slowly. Alternatively, when switching a voltage of an internal address without a high resistance from an (H) level to an (L) level, because there is no influence from a high resistance it is switched within a predetermined period of time. Therefore, when switching, a time lag occurs and a selection defect of a state where two addresses are selected is produced.

The bit line multiple address selection will be explained based on FIG. 3. In the timing t1 of FIG. 3, corresponding to an address control signal for switching a voltage which is applied to the bit line M73Ba (not shown in the drawing) and the bit line M73Bb from an (H) level to an (L) level and for switching a voltage applied to the bit line M74Ba and the bit line M74Bb from an (L) level to an (H) level, the voltage of M73Bb is switched from an (H) level to an (L) level. Alternatively, as for the bit line M74Ba and M74Bb which are supposed to be switched from an (L) level to an (H) level, while the bit line M74Bb is switched in response to the address control signal, the switching of M74Ba is not conducted smoothly and takes time until the timing t2. This state is the multiple address selection 200. The voltage of the bit line M74Ba which is originally supposed to be at an (H) level is still at an (L) level and the bit line M73Bb which is supposed to switch from an (H) level to an (L) level switches correctly in response to switching. Therefore, the bit lines M73Bb and M74Ba which are originally supposed to be at different voltage levels become the same level and a selection defect occurs.

Next, the multiple address selection of a word line will be explained. In the timing t1 of FIG. 4, the word line WL251 is selected and the voltage which is applied to the word line WL251 is switched from an (L) level to an (H) level. In the timing t2, a word line to be selected is switched from the word line WL251 to the word line WL250. In response, the voltage which is applied to the word line WL251 is switched from an (H) level to an (L) level and the voltage which is applied to the word line WL250 is switched from an (L) level to an (H) level. The switching is carried out by switching the internal address control signal which selects a word line. Here, a word line is generally selected by switching a (0) level voltage to a (1) level voltage (a (0) level voltage is lifted to a (1) level voltage) and non selection is conducted by switching a (1) level voltage to a (0) level voltage (a (1) level voltage is dropped to a (0) level voltage). Therefore, in the timing t2 of FIG. 4, in order to select the word line WL250, the corresponding internal address control signal is lifted from a (0) level to a (1) level. The internal address control signal which corresponds to the word line WL251 where selection is finished, is dropped from a (1) level to a (0) level.

In the timing t3 in FIG. 4, the word line WL250 is non-selected (that is, the voltage which is applied is switched from an (H) level to an (L) level) and the word line WL24F is selected (that is, the voltage which is applied is switched from an (L) level to an (H) level). This control is conducted by dropping the address control signal of the word line WL250 from a (1) level to a (0) level and lifting the internal address control signal of the word line WL 24F from a (0) level to a (1) level. However, due the mounting of a high resistance, dropping of the internal address control signal of the word line WL250 from a (1) level to a (0) level cannot be conducted within a predetermined period of time and as a result, switching to the non selection of the word line WL250 begins at the timing t5 and switching ends at the timing t6. Although switching is originally supposed to finish at the timing t3, it becomes a state where it doesn't finish until the timing t6. Therefore, during this time, the word lines WL24F and WL250 become a selected state. This is the multiple address selection of the word line.

Next, the cause of a defect occurring which is called the multiple address selection will be explained. A NOR type flash memory and an SRAM includes a function which is call an automatic sleep function and in order to control energy consumption, when a certain fixed period of time has elapsed the internal address control signal (DECEN) within the device is fixed at Fix L or Fix H. In an NOR type flash memory, when a few hundred ns (usually 150 ns) has elapsed, fixing is conducted. Although there is a difference in the predetermined period of time of an SRAM, when a fixed period of time has elapsed (a few hundred ns) the point where fixing of the internal address control signal (DECEN) is conducted is the same.

As long as the NOR type flash memory operates based on a clock with short cycle (here, a cycle shorter than 150 ns) the internal address control signal (DECEN) is not fixed at Fix L or Fix H. Therefore, as is shown in FIG. 5, in case of operating based on a short cycle clock, when the internal address control signal (DECEN) is once started to activate, the operation is continued. Next, the case where an external address is switched during this state will be explained based on FIG. 5. In FIG. 5, an internal address b1 (8) corresponds to an external address a1 (6) and an internal address b2 (9) corresponds to an external address a2 (7).

In the timing t1 in FIG. 5, in response to an instruction to switch the external address a1 (6) which was at an (H) level until then, to an (L) level and the external address a2 (7) which was at an (L) level to an (H) level, an instruction is given to switch the internal address b1 (8) which was an (H) level until then, to an (L) level and the internal address b2 (9) which was an (L) level until then, to an (H) level.

By the above stated instruction, in the timing t2, the external address a1 (6) is switched from an (H) level to an (L) level and the external address a2 (7) is switched from an (L) level to an (H) level while the internal address b1 (8) is switched from an (H) level to an (L) level and the internal address b2 (9) is switched from an (L) level to an (H) level.

Further, in the timing t3, in response to an instruction to switch the external address a2 (7) which was an (H) level until then, to an (L) level and the external address a1 (6) which was an (L) level to an (H) level, an instruction is given to switch the internal address b1 (8) which was an (H) level until then, to an (L) level and the internal address b2 (9) which was an (L) level until then, to an (H) level.

By the stated instruction, in the timing t4, the external address a1 (6) is switched from an (L) level to an (H) level and the external address a2 (7) is switched from an (H) level to an (L) level while the internal address b1 (8) is switched from an (L) level to an (H) level and the internal address b2 (9) is switched from an (H) level to an (L) level. In the timing t5 below, an instruction to switch the external address is given and the switching is conducted.

In this way, in the case where a NOR flash memory is operating based on a short cycle clock, the internal address control signal (DECEN) is not fixed and the internal address b1 (8) and b2 (9) are switched corresponding to the external address a1 (6) and a2 (7).

Alternatively, in the case where the NOR type flash memory is operating based on a clock with long cycle (here a longer cycle than 150 ns), the internal address control signal (DECEN) is fixed at Fix L or Fix H after a predetermined period of time has elapsed (here, 150 ns). The case where the external address is switched in this state is explained based on FIG. 6. In FIG. 6, the internal address b1 (8) corresponds to the external address a1 (6) and the internal address b2 (9) corresponds to the external address a2 (7).

In the timing t1 in FIG. 6, in response to an instruction to switch the external address a1 (6) which was an (H) level until then, to an (L) level and the external address a2 (7) which was an (L) level to an (H) level, an instruction is given to switch the internal address b1 (8) which was an (H) level until then, to an (L) level and the internal address b2 (9) which was an (L) level until then, to an (H) level.

By the instruction, in the timing t2, the external address a1 (6) is switched from an (H) level to an (L) level and the external address a2 (7) is switched from an (L) level to an (H) level while the internal address b1 (8) is switched from an (H) level to an (L) level and the internal address b2 (9) is switched from an (L) level to an (H) level. Because the NOR type flash memory is operating based on a long cycle clock, the internal address control signal (DECEN) is fixed at Fix L or Fix H after a predetermined period of time has elapsed (here, 150 ns). In the timing t1 in FIG. 6, the internal address control signal (DECEN) is fixed at Fix L. However, corresponding to the switching instruction of the above stated external address, the internal address control signal (DECEN) is activated and is shifted to an (H) level.

The timing t3 is the point of time where 150 ns have elapsed since the timing t2. Therefore, in the timing t3 the internal address control signal (DECEN) is made to be fixed at Fix L despite the external address not being switched.

Together with the previously stated internal address control signal (DECEN) being made to be fixed at Fix L, the internal address b2 (9) which was an (H) level until the timing t3 is shifted to an (L) level and in the timing t4 becomes an (L) level. Alternatively, the internal address b1 (8) which was an (L) level until the timing t3 is maintained at an (L) level. Therefore, in the timing t4, the internal address b1 (8) and b2 (9) both become an (L) level.

In the timing t5, in response to an instruction to switch the external address a1 (6) which was an (L) level until then, to an (H) level and the external address a2 (7) which was an (H) level to an (L) level, an instruction is given to switch the internal address b1 (8) which was an (L) level until then, to an (H) level and the internal address b2 (9) which should have been an (H) level until then without fixing of the internal address control signal (DECEN), to an (L) level. Together with this, in the timing t6, the internal address control signal (DECEN) activates corresponding to the switching instruction of the external address and the internal address b1 (8) which was an (L) level until then is shifted to an (H) level.

Alternatively, the internal address b2 (9) has already shifted to (L) level together with the forced fixing of the internal address control signal (DECEN) at Fix L in the timing t4. Therefore, the internal address b2 (9) is not switched although it should be switched in response to the corresponding external address a2 (7) switched from an (H) level to an (L) level.

In the timing t5 and the timing t6, although the external address a2 (7) is shifted, the switching of the corresponding internal address b2 (9) does not occur and because this is the same phenomenon as the case of a defect mode caused by high resistance (address selection defect) it is judged as a defect at the time of a test.

The timing t7 is the point of time when 150 ns have elapsed since t6. In the timing t7, the internal address control signal (DECEN) is again forced to be fixed at Fix L. Together with this, the internal address b1 (8) which was an (H) level begins to shift to an (L) level and in the timing t8 shifts to an (L) level. On the other hand, the internal address b2 (9) which was an (L) level until then is maintained at an (L) level. Therefore, in the timing t8 the internal address b1 (8) and b2 (9) both become an (L) level.

In the timing t9 in response to an instruction to switch the external address a1 (6) which was an (H) level until then, to an (L) level and the external address a2 (7) which was an (L) level to an (H) level, an instruction is given to switch the internal address b1 (8) which should have been an (H) level until then without fixing the internal address control signal (DECEN), to an (L) level and the internal address b2 (9) which was an (L) level until then, to an (H) level. Together with this, the internal address b2 (9) begins to shift to an (L) level. Alternatively, the internal address b1 (8) has already shifted to (L) level together with the forced fixing of the internal address control signal (DECEN) at Fix L in the timing t8. Therefore, the internal address b1 (8) is not shifted to an (L) level, although it should be switched in response to the corresponding external address a1 (6) switched from an (H) level to an (L) level.

Generally, when a high resistance is mounted within a device, a selection defect called a multiple address selection will be occurred as explained using FIG. 3, in the case where a device enters a state of automatic sleep, an internal address which is supposed to be switched corresponding to the switching of an external address, are all started from an (L) level and the state where the internal address is not switched corresponding to the switching of the external address is understood to be the same state as a multiple address selection in appearance in a READ test. Therefore, it is not possible to realize by a READ test whether a semiconductor memory which undergoes a test is a device which has a defect of the multiple address selection or not (that is, a device which does not pass the test), a different test is required and becomes an impediment to the effectiveness of tests.

Figure 2:
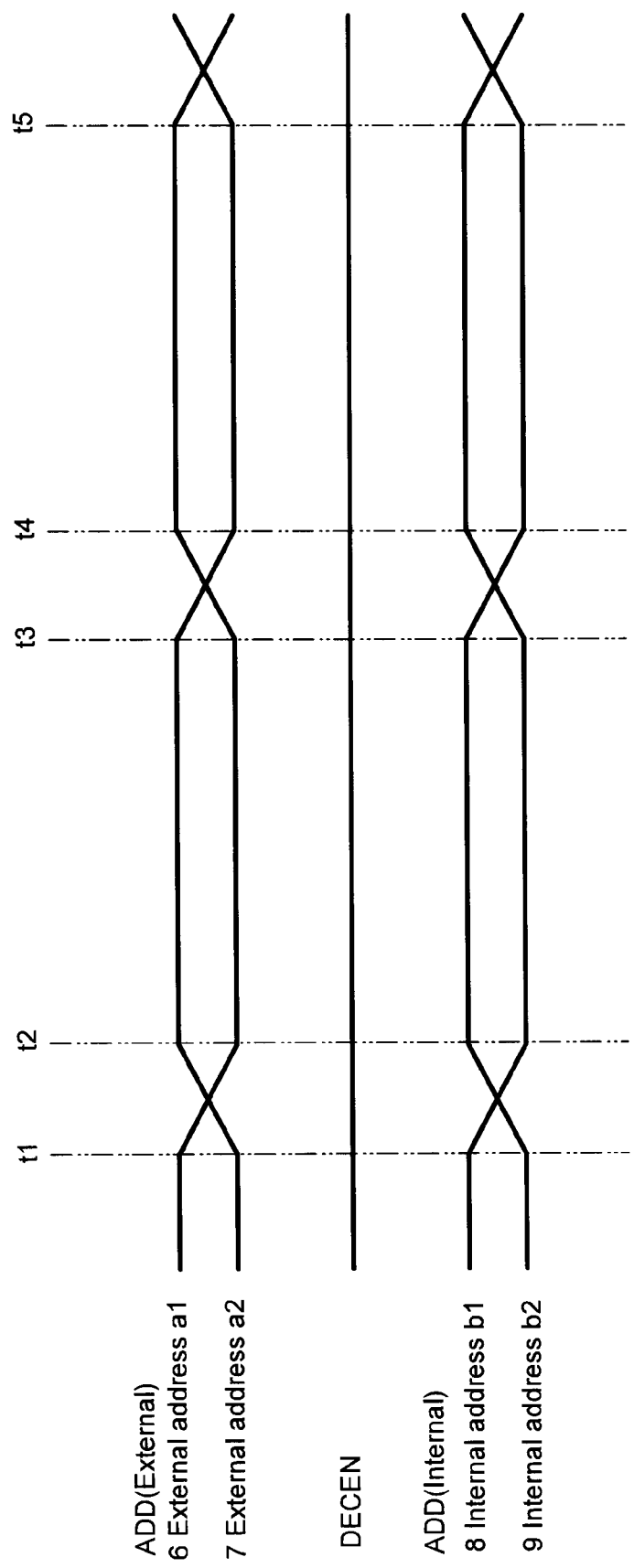
FIG. 2 is a timing chart which depicts the switching of an external address and an internal address at the time of READ in a NOR type flash memory relating to a first embodiment of this invention.

Because the semiconductor memory device relating to one embodiment of the present invention includes an internal address control signal selection circuit 10, even if it is a device which includes a so called automatic sleep function of a NOR type flash memory or an SRAM it is possible to detect a selection defect which is called a multiple address selection by a READ test. The effects of the present invention when an external address is switched in the test of a NOR type flash memory will be explained based on FIG. 2. FIG. 2 is a timing chart which shows the switching of an external and internal address at the time of READ in a NOR type flash memory relating to one embodiment of the present invention. In FIG. 2 the internal address b1 (8) corresponds to the external address a1 (6) and the internal address b2 (9) corresponds to the external address a2 (7).

In the timing t1 of FIG. 2, in response to an instruction to switch the external address a1 (6) which was an (H) level until then, to an (L) level and the external address a2 (7) which was an (L) level to an (H) level, an instruction is given to switch the internal address b1 (8) which was an (H) level until then, to an (L) level and the internal address b2 (9) which was an (L) level until then, to an (H) level.

By the previously stated instruction, in the timing t2, the external address a1 (6) is switched from an (H) level to an (L) level and the external address a2 (7) is switched from an (L) level to an (H) level while the internal address b1 (8) is switched from an (H) level to an (L) level and the internal address b2 (9) is switched from an (L) level to an (H) level.

Further, in the timing t3, in response to an instruction to switch the external address a2 (7) which was an (H) level until then, to an (L) level and the external address a1 (6) which was an (L) level to an (H) level, an instruction is given to switch the internal address b2 (9) which was an (H) level until then, to an (L) level and the internal address b1 (8) which was an (L) level until then, to an (H) level.

By the previously stated instruction, in the timing t4, the external address a1 (6) is switched from an (L) level to an (H) level and the external address a2 (7) is switched from an (H) level to an (L) level while the internal address b1 (8) is switched from an (L) level to an (H) level and the internal address b2 (9) is switched from an (H) level to an (L) level. In the following timing t5, an instruction to switch the external address is given and the switching is conducted.

Here, because the semiconductor memory which undergoes a test is a NOR type flash memory, the internal address control signal (DECEN) is fixed at Fix L when 150 ns have elapsed. However, because the semiconductor memory device relating to a first embodiment of this invention includes an internal address control signal selection circuit 10, and a second internal address control signal (DECEN 2) is generated by a second internal address control signal generation part 11 which receives a test mode command from the tester 20, the internal address signal (DECEN) generated by the internal address generation circuit 3 continues to maintain a fixed level. As a result, in the timing t3 shown in FIG. 2, more than 150 ns have elapsed since the timing t2, yet, as shown in FIG. 6, the internal address signal (DECEN) is not fixed at either Fix L or Fix H. Because once the second internal address signal (DECEN 2) is activated it maintains a fixed level according to a first embodiment of this invention, even if it is a NOR type flash memory the internal address is switched corresponding to the switching of the external address. Therefore, all the internal addresses do not activate from a Fix L state and it is possible to detect a selection defect called a multiple address selection by a READ test.

This effect is the result of the semiconductor memory device of a first embodiment of this invention as stated above having an internal address control signal selection circuit 10. Such an effect is exerted because the second internal address control signal generation part 11 which received an external command is a second internal address control signal which maintains a fixed level and the memory device includes an OR transistor which constantly transmits either the second internal address control signal or a usual first internal address control signal to the internal address generation circuit 3.

Embodiment

According to a first embodiment of this invention, it is possible to detect a selection defect called a multiple address selection by a READ test in a NOR type flash memory and an SRAM where an automatic sleep function operates when a fixed period of time has elapsed (generally 150 ns). If an internal address control signal selection circuit relating to the first embodiment of this invention is used, it is possible to obtain the same effects in a NOR type flash memory and an SRAM which includes a BIST control circuit.

In recent times, with the large capacity and miniaturization of semiconductor memory devices, a broad range of product inspections before shipment is demanded and an inspection device called a tester is also becoming a more complex device. For example, in a memory cell array test, the tester must externally provide a test address for a memory cell, data to be programmed to a memory cell, a control signal which specifies programming and reading, and read data for judging a test result etc to a chip which is mounted with a memory cell array, and the tester is also needed to extract them. However, there is a physical limitation to the number of input and output pins that can be attached to a chip and a sufficient test becomes difficult to realize. Also, in a high performance chip, impedance etc of a transmission line which connects a semiconductor memory to be tested and a tester may interrupt outside supply of test data at a high throughput in line with capability.

In order to deal with this situation, a BIST method (built-in self test) which arranges a circuit called a BIST control circuit (built-in self test circuit) for carrying out a test itself within a chip is adopted.

The BIST control circuit generally includes a test pattern generation circuit which generates a test pattern which is provided to a target circuit of the test, a test pattern compression circuit which compresses an output pattern from the target circuit of the test and a comparison circuit which compares a compressed test pattern with an expected output pattern inside thereof. The BIST control circuit automatically conducts generation of the test pattern which is provided to a semiconductor memory device to be tested, and conducts analysis of a test result from the semiconductor memory device to be tested within the semiconductor memory device to be tested at the time of the test. Therefore it can be judged whether there is a defect within the semiconductor memory device to be tested with the BIST control circuit.

In the semiconductor memory device which includes the above stated BIST control circuit, the generation of a test pattern and the analysis of a test result is carried out as a sequence of operations, (below, this operation is written as BIST operation) however, the BIST operation is carried out as a base of an internal timer within the device. Therefore, when the BIST operation is conducted it becomes an internal operation of a long cycle of a few hundred ns.

As stated above, because the BIST operation becomes an internal operation of a long cycle of a few hundred ns, when the BIST control circuit is mounted in a NOR type flash memory and an SRAM, a problem occurs. That is, in order to make the BIST control circuit operate, in the case of a long cycle internal operation, because a NOR type flash memory and an SRAM include an automatic sleep function in order to control energy consumption, the automatic sleep function is activated.

Because the previously stated function automatically fixes an internal address control signal (DECEN) at Fix L or Fix H generally when 150 ns has elapsed, as a result, in the READ test, an internal address which is supposed to switch corresponding to the switching of an external address only conducts the switching operation from a fixed (L) level or a fixed (H) level. In appearance, this is the same phenomenon as the multiple address selection which is generated due to an unusually high resistance mounted during the manufacturing process. Therefore, in the READ test, even if it is a non defective product, it might be judged as a multiple address selection (selection defect) caused by high resistance. As a result, a defect of the multiple address selection can not be detected by the READ test. This is as explained using FIG. 6 in the first embodiment.

In a semiconductor memory device of a second embodiment of the present invention, even in a NOR type flash memory and an SRAM which includes a BIST control circuit, it is possible to detect a defect caused by a multiple address selection by a READ test.

FIG. 7 is an outline construction drawing of a semiconductor memory device relating to a second embodiment of this invention. In FIG. 7, a NOR type flash memory including a BIST control circuit is shown, however, this can also be an SRAM which includes a BIST control circuit. Also, this is not limited to a NOR type flash memory and an SRAM, as long as it is a semiconductor memory device including a BIST control circuit within a semiconductor memory device which has a function which fixes an internal address to an (L) level or an (H) level after a fixed period of time has elapsed, then the effects are the same.

A semiconductor memory device relating to a second embodiment of the present invention will be explained based on FIG. 7. The semiconductor memory device 100 relating to a second embodiment of the present invention is arranged with a memory cell array 1, a decoder 2, an internal address generation circuit 3, a first internal address control signal generation part 4, a BIST control circuit 5 and an internal control signal selection circuit 10.

Although not shown in the drawing, the BIST control circuit 5 includes a test pattern generation circuit which generates a test pattern which is provided to the target circuit of the test, a test pattern compression circuit which compresses an output pattern from the target circuit of the test and a comparison circuit which compares a compressed test pattern with an expected output pattern and a circuit which conducts a self test inside thereof.

The internal address generation circuit 3 which received the test pattern generates an internal address based on an external address indicated by the test data, transmits this to the decoder 2 and by selecting a memory cell which corresponds to the internal address indicated by the decoder 2, conducts a test.

At the time of generating the internal address, the second internal address control signal generation part 11, which received a test mode command from the BIST control circuit 5, generates a second internal address control signal (DECEN 2) and outputs. The second internal address control signal (DECEN 2) is a signal which maintains a fixed level. Alternatively, the first internal address control signal (DECEN 1) which is generated by the first internal address control signal generation part 4 is made to be fixed at an (L) level or an (H) level after a fixed period of time has elapsed in order to reduce energy consumption in a NOR type flash memory and an SRAM. However, in the semiconductor memory device relating to a second embodiment of this invention, in an OR gate transistor 12 within the internal address control signal selection circuit 10, either the first internal address control signal (DECEN 1) or the second internal address control signal (DECEN 2) is constantly transmitted to the internal address generation circuit 3. Therefore, even if the first internal address control signal (DECEN 1) is made to be fixed at an (L) level after 150 ns has elapsed, because the second internal address control signal (DECEN 2) is transmitted to the internal address generation circuit 3, the internal address switches appropriately corresponding to the switching of the external address.

This effect is as explained based on FIG. 2 in the first embodiment of this invention, and even in the second embodiment of this invention, when the second internal address control signal (DECEN 2) is once activated, because it is maintained at a fixed level, because the internal address control signal is made to be fixed at Fix L, all the internal addresses are switched from a Fix L state and the same phenomenon as the defective mode caused by high resistance does not occur. Even in power saving mode, the internal address is appropriately switched corresponding to the switching of the external address. Therefore, even in the case where a self test is conducted by the BIST control circuit, it is possible to detect a selection defect of the multiple address selection by a READ test.

What is claimed is:

1. A semiconductor memory device comprising:
    an internal address generation circuit which generates an internal signal based on input address data;
    a first internal address control signal generation part which generates a first internal address control signal and includes a function for fixing said first internal address control signal at a predetermined level with the elapse of a fixed period of time;
    a second internal address control signal generation part which generates a second internal address control signal according to an input of a predetermined command, said second internal address control signal instructing said internal address generation circuit to generate said internal address signal based on said address data; and
    an internal address control signal selection circuit which selects according to an input test mode signal either said first internal address control signal or said second internal address control signal, said internal address control signal selection circuit also including an OR gate transistor which transmits to said internal address generation circuit, and at the time of a test mode said internal address control signal selection circuit selects said second internal address control signal and transmits to said internal address generation circuit.

2. The semiconductor memory device according to claim 1, wherein said internal address control signal selection circuit includes said second internal address control signal generation part and said OR gate transistor;
    an input part of said OR gate transistor is connected to said first internal address control signal generation part and said second internal address control signal part;
    an output part of said OR gate transistor is connected to said internal address generation circuit; and
    said internal address control signal selection circuit generates said second internal address control signal and constantly transmits to said internal address generation circuit according to an input of said command at the time of said test mode.

3. The semiconductor memory device according to claim 2, wherein said second internal address control signal generation part constantly transmits said second internal address control signal at a predetermined voltage to said internal address generation circuit at the time of a test mode, and said internal address signal is switched in said internal address generation circuit according to a switch in an external address.

4. The semiconductor memory device according to claim 3, wherein in a test mode,
    said second internal address control signal generation part receives a command from a tester for instructing to operate in said test mode and generates said second internal address control signal which maintains a fixed level;

said internal address control signal selection circuit selects
said second internal address control signal at the time of
said test mode and transmits to said internal address
generation circuit; and said internal address generation circuit receives said second internal address control signal and generates said
internal address signal based on said address data input
from said tester.

5. The semiconductor memory device according to claim 1, wherein said first internal address control signal generation part switches a voltage of said first internal address control signal and fixes said voltage at said predetermined level with the elapse of fixed period of time; and said internal address generation circuit switches said voltage of said internal address signal when said voltage of said first internal address control signal is switched at the time of a usual mode.

6. The semiconductor memory device according to claim 1; wherein said semiconductor memory device is a NOR type flash memory or an SRAM which fixes during more than a fixed period of time a level of an internal address when said address data does not change.

7. The semiconductor memory device according to claim 5, wherein said internal address control signal selection circuit selects said first internal address control signal and transmits to said internal address generation circuit at the time of said usual mode;

and said internal address generation circuit generates said internal address signal based on said first internal address control signal and said address data at the time of said usual mode.

8. A semiconductor memory device comprising:

an internal address generation circuit which generates an internal address signal based on an address data input;

a first internal address control signal generation part which generates a first internal address control signal and has a function for fixing said first internal address control signal at a predetermined level with the elapse of a fixed period of time;

a second internal address control signal generation part which generates a second internal address control signal corresponding to an input of a predetermined command, said second internal address control signal instructing said internal address generation circuit to generate said internal address signal based on said address data;

an internal address control signal selection circuit which selects according to an input test mode signal either said first internal address control signal or said second internal address control signal, said internal address control signal selection circuit also including an OR gate transistor which transmits to said internal address generation circuit, and at the time of a test mode said internal address control signal selection circuit selects said second internal address control signal and transmits to said internal address generation circuit; and a test control circuit connected with said internal address generation circuit and said second internal address control signal generation part, said test control circuit generating a test pattern and determines a test result, transmitting said test pattern to said internal address generation circuit at the time of a test mode and inputting a command to said second internal address control signal generation part for instructing operating at said tester mode.

9. The semiconductor memory device according to claim 8; wherein said internal address control signal selection circuit includes said second internal address control signal generation part and said OR gate transistor;

an input part of said OR gate transistor is connected to said first internal address control signal generation part and said second internal address control signal part;

an output part of said OR gate transistor is connected to said internal address generation circuit; and said internal address control signal selection circuit generates said second internal address control signal and constantly transmits to said internal address generation circuit according to an input of said command at the time of said test mode.

10. The semiconductor memory device according to claim 8, wherein said second internal address control signal generation part receives said command from said test control circuit and constantly transmits said second internal address control signal at a predetermined voltage to said internal address generation circuit, and said internal address signal is switched in said internal address generation circuit according to a switch in an external address.

11. The semiconductor memory device according to claim 8, wherein in a test mode, said test control circuit inputs said tester pattern to said internal address generation circuit at the time of said test mode;

said internal address control signal selection circuit selects said second internal address control signal at the time of said test mode and transmits to said internal address generation circuit; and said internal address generation circuit receives said second internal address control signal at the time of said test mode and generates said internal address signal based on said test pattern transmitted from said test control circuit.

12. The semiconductor memory device according to claim 8, wherein said first internal address control signal generation part switches the voltage of said first internal address control signal and fixes said voltage at said predetermined level with the elapse of fixed period of time; and said internal address generation circuit switches said voltage of said internal address signal when said voltage of said first internal address control signal is switched, at the time of a usual mode.

13. The semiconductor memory device according to claim 8; wherein said semiconductor memory device is a NOR type flash memory or an SRAM which fixes during more than a fixed period of time a level of an internal address when said address data does not change.

14. The semiconductor memory device according to claim 12, wherein said internal address control signal selection circuit selects said first internal address control signal and transmits to said internal address generation circuit at the time of said usual mode;

and said internal address generation circuit generates said internal address signal based on said first internal address control signal and said address data at the time of said usual mode.

15. A semiconductor memory device comprising:

a memory cell array in which a plurality of memory cells are arrayed in a matrix;

an internal address generation circuit which generates an internal signal which selects one or more memory cells from among said plurality of memory cells based on input address data;

a first internal address control signal generation part which generates a first internal address control signal which generates said internal address signal, and includes a function for fixing said first internal address control signal at a predetermined level with the elapse of a fixed period of time;

a second internal address control signal generation part which generates a second internal address control signal according to an input of a predetermined command, said second internal address control signal instructing said internal address generation circuit to generate said internal address signal based on said address data; and an internal address control signal selection circuit which selects according to an input mode signal either said first internal address control signal or said second internal address control signal, said internal address control signal selection circuit also including an OR gate transistor which transmits to said first internal address generation circuit, said internal address control signal selection circuit also including an output part which outputs said second internal address control signal to said internal address generation circuit, said second internal address control signal being constantly transmitted at a predetermined voltage from said second internal address control signal generation part.

16. The semiconductor memory device according to claim 15, wherein said first internal address control signal generation part includes a function which switches a voltage of said first internal address control signal when a fixed period of time has elapsed and fixes said voltage at a predetermined level;

said second internal address control signal generation part constantly transmits said second internal address control signal at a predetermined voltage at the time of a test mode; and said internal address control signal selection circuit selects said second internal address control signal and transmits to said internal address generation circuit at the time of said test mode; and said internal address generation circuit switches said internal address signal according to a switch in an external address at the time of said test mode.

17. The semiconductor memory device according to claim 16, wherein said second internal address control signal generation part receives a command instruction to operate in test mode and constantly transmits said second internal address control signal at a predetermined voltage.

18. The semiconductor memory device according to claim 15, wherein said first internal address control signal generation part switches a voltage of said first internal address control signal and fixes said voltage at said predetermined level with the elapse of a fixed period of time; and said internal address generation circuit switches said voltage of said internal address signal when said voltage of said first internal address control signal is switched at the time of a usual mode.

19. The semiconductor memory device according to claim 18, wherein said internal address control signal selection circuit selects said first internal address control signal and transmits to said internal address generation circuit at the time of said usual mode;

and said internal address generation circuit generates said internal address signal based on said first internal address control signal and said address data at the time of said usual mode.

* * * * *